United States Patent
Wang

(10) Patent No.: US 8,784,591 B2
(45) Date of Patent: Jul. 22, 2014

(54) PROCESS FOR PRODUCING LIQUID EJECTION HEAD

(71) Applicant: Canon Kabushiki Kaisha, Tokyo (JP)

(72) Inventor: Shinan Wang, Kashiwa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/760,280

(22) Filed: Feb. 6, 2013

(65) Prior Publication Data

US 2013/0220522 A1   Aug. 29, 2013

(30) Foreign Application Priority Data

Feb. 29, 2012   (JP) ................. 2012-043262

(51) Int. Cl.
| | |
|---|---|
| *B29C 65/52* | (2006.01) |
| *B32B 37/12* | (2006.01) |
| *B32B 38/10* | (2006.01) |
| *C09J 5/02* | (2006.01) |
| *B29C 65/48* | (2006.01) |
| *H01L 21/683* | (2006.01) |

(52) U.S. Cl.
CPC ............ B29C 65/48 (2013.01); *H01L 21/6835* (2013.01)
USPC ........... 156/153; 156/247; 156/249; 156/257; 156/280; 156/307.3

(58) Field of Classification Search
CPC ............................ B29C 65/48; H01L 21/6835
USPC ......... 156/152–154, 247, 249, 250, 257, 278, 156/280, 307.1, 307.3, 307.5; 29/25.35, 29/890.1
See application file for complete search history.

(56) References Cited

U.S. PATENT DOCUMENTS

| | | |
|---|---|---|
| 2010/0041211 A1 | 2/2010 | Noda et al. |
| 2012/0212548 A1* | 8/2012 | Koseki ........................ 347/71 |
| 2013/0162725 A1 | 6/2013 | Suzuki et al. |

FOREIGN PATENT DOCUMENTS

| | | |
|---|---|---|
| JP | 2003-103787 A | 4/2003 |
| JP | 4565804 A | 10/2010 |

* cited by examiner

*Primary Examiner* — Sing P Chan
(74) *Attorney, Agent, or Firm* — Fitzpatrick, Cella, Harper & Scinto

(57) ABSTRACT

A process for producing a liquid ejection head includes a provision step of providing a piezoelectric substrate, and a first and a second support substrate for supporting the piezoelectric substrate; a bonding step of bonding one surface of the first support substrate to one principal surface of two principal surfaces of the piezoelectric substrate; a groove forming step of forming a groove in the other principal surface of the two principal surfaces of the piezoelectric substrate; an electrode forming step of forming a first electrode on at least one surface of a lateral surface of the groove, a bottom surface of the groove and the other principal surface remaining after the groove is formed; a joining step of joining one surface of the second support substrate to the other principal surface of the piezoelectric substrate; and a separation step of separating the first support substrate from the piezoelectric substrate.

11 Claims, 7 Drawing Sheets

PROCESS FOR PRODUCING LIQUID EJECTION HEAD

BACKGROUND OF THE INVENTION

1. Field of the Invention

The present invention relates to a process for producing a liquid ejection head provided with a piezoelectric substrate for ejecting a liquid such as an ink.

2. Description of the Related Art

A liquid ejection head provided with a piezoelectric substrate containing a piezoelectric material such as PZT (Pb(Zr, Ti)O$_3$; lead zirconate titanate) is known.

In the liquid ejection head provided with the piezoelectric substrate, a groove is formed in the piezoelectric substrate, and a pressure chamber for applying an ejection pressure to an ink is formed by a wall of the groove and a member covering an opening of the groove. An electrode electrically connected to the head substrate is provided on an internal wall surface and an external wall surface of the groove. A voltage is applied to the electrode from the head substrate, whereby the wall of the groove is deformed to change a capacity of the pressure chamber and apply an ejection pressure to an ink within the pressure chamber, thereby ejecting an ink droplet from an ejection orifice communicated with the pressure chamber.

With the miniaturization of a recording apparatus provided with such a liquid ejection head, it is required to miniaturize the liquid ejection head. In order to miniaturize the liquid ejection head, thinner piezoelectric substrates have been developed.

However, the piezoelectric substrate is a relatively fragile brittle substrate. In a brittle substrate insufficient in thickness, there has been a possibility that when the brittle substrate is grasped with relatively strong force upon forming of a groove in the brittle substrate, the brittle substrate may be broken. Thus, Japanese Patent Application Laid-Open No. 2003-103787 and Japanese Patent No. 4565804 disclose a process for forming a groove in a brittle substrate without incurring breakage of the brittle substrate even when the brittle substrate is relatively thin.

Japanese Patent Application Laid-Open No. 2003-103787 discloses a process for forming a groove in a piezoelectric substrate as the brittle substrate. First, a support substrate harder than the piezoelectric substrate is provided. The support substrate is temporarily fixed on to one of two principal surfaces (surfaces facing in a thickness direction of the piezoelectric substrate) of the piezoelectric substrate so as not to cover a partial edge of said one principal surface. Then, the support substrate is grasped to conduct dicing from the partial edge of said one principal surface toward the other principal surface, thereby forming a plurality of grooves in the form of a comb. Thereafter, the piezoelectric substrate is bonded to a head substrate, and the support substrate is then separated from the piezoelectric substrate.

According to the process described in Japanese Patent Application Laid-Open No. 2003-103787, a relatively thin piezoelectric substrate is not broken upon the formation of the grooves because the piezoelectric substrate is not directly grasped.

Japanese Patent No. 4565804 discloses such a technique called WSS (Wafer Support System) that the thickness of a brittle substrate is reduced to a desired thickness. In WSS, a relatively thick brittle substrate is first provided as a substrate to be subjected to grinding, and the brittle substrate having a sufficient thickness is grasped to from a groove in the brittle substrate. Then, the brittle substrate is joined to a support substrate so as to cover one principal surface of the brittle substrate, and the other principal surface of the brittle substrate is ground to reduce the thickness of the brittle substrate. The brittle substrate is separated from the support substrate at the time of reaching a desired thickness.

According to the process described in Japanese Patent No. 4565804, the brittle substrate is not broken even when the brittle substrate is grasped with relatively strong force because the brittle substrate has the sufficient thickness when the groove is formed.

In recent years, a liquid ejection device has been used for a relatively large-sized recording medium. In order to produce a liquid ejection head capable of conducting large-size printing, there is a tendency to use a larger piezoelectric substrate in addition to reduction in the thickness of the piezoelectric substrate.

However, there has been a limit in such a large and thin piezoelectric substrate in the process described in Japanese Patent Application Laid-Open No. 2003-103787.

In the process described in Japanese Patent Application Laid-Open No. 2003-103787, the support substrate is temporarily fixed on to one principal surface of the piezoelectric substrate so as not to cover a partial edge of said one principal surface, and dicing is conducted from the edge portion of said one principal surface toward the other principal surface, thereby forming the grooves. Therefore, the edge portion of the piezoelectric substrate is bent in a thickness direction of the piezoelectric substrate upon the dicing. When the piezoelectric substrate is made large and thin, flexural rigidity of the piezoelectric substrate is lowered, so that there has been a possibility that the piezoelectric substrate may be broken due to curving in the thickness direction of the piezoelectric substrate.

In addition, Japanese Patent No. 4565804 only discloses an example where a silicon wafer was used as a substrate to be ground and does not disclose an application example where a piezoelectric substrate was provided as a substrate to be ground. If a piezoelectric substrate is used as a substrate to be ground, and the piezoelectric substrate can be made thinner, any supporting member is not provided on a principal surface different from the principal surface which has been joined to the support substrate. Accordingly, there has been a possibility that force in the thickness direction may be applied to the piezoelectric substrate thinned when the support substrate is separated from the piezoelectric substrate to break the piezoelectric substrate.

SUMMARY OF THE INVENTION

A process for producing a liquid ejection head, comprising the following steps:

a provision step of providing a piezoelectric substrate, and a first support substrate and a second support substrate for supporting the piezoelectric substrate;

a bonding step of bonding one surface of the first support substrate to one principal surface of two principal surfaces of the piezoelectric substrate;

a groove forming step of forming a groove in the other principal surface of the two principal surfaces of the piezoelectric substrate;

an electrode forming step of forming a first electrode on at least one surface of a lateral surface of the groove, a bottom surface of the groove and the other principal surface remaining after the groove is formed;

a joining step of joining one surface of the second support substrate to the other principal surface of the piezoelectric substrate; and a separation step of separating the first support substrate from the piezoelectric substrate.

A process for producing a liquid ejection head, comprising the following steps:

a provision step of providing a piezoelectric substrate, and a first support substrate and a second support substrate for supporting the piezoelectric substrate;

a step of forming a first mark and a first electrode positioned using the first mark as a reference on one principal surface of two principal surfaces of the piezoelectric substrate;

a step of forming an electrode pad on the other principal surface of the two principal surfaces of the piezoelectric substrate to electrically connect the first electrode to the electrode pad and forming a second mark positioned using the first mark as a reference on the other principal surface;

a step of bonding one surface of the first support substrate to said one principal surface of the piezoelectric substrate;

a step of forming a groove positioned using the second mark as a reference in the other principal surface;

a step of forming a second electrode electrically separated from the first electrode on at least one surface of a lateral surface of the groove, a bottom surface of the groove and the other principal surface remaining after the groove is formed;

a joining step of joining one surface of the second support substrate to the other principal surface of the piezoelectric substrate; and a separation step of separating the first support substrate from the piezoelectric substrate.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

First Embodiment:

First, a process for producing a liquid ejection head for ejecting a liquid such as an ink according to a first embodiment will be described with reference to FIGS. 1A to 1E. This embodiment is a process of processing a piezoelectric substrate after the piezoelectric substrate is bonded to a first support substrate, joining the processed piezoelectric substrate to a second support substrate, and then separating the first support substrate from the piezoelectric substrate.

FIGS. 1A to 1E are sectional views illustrating the process for producing a liquid ejection head according to this embodiment.

Figure 1A:
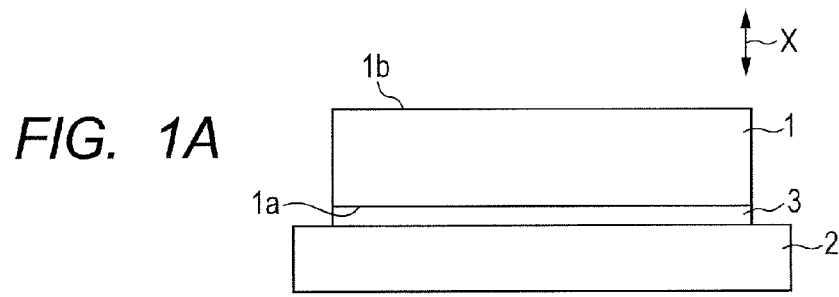
FIGS. 1A, 1B, 1C, 1D and 1E are sectional views illustrating a process for producing a liquid ejection head according to a first embodiment.

As illustrated in FIG. 1A, the piezoelectric substrate 1 is first bonded to the first support substrate through a bonding layer 3. A surface of the piezoelectric substrate 1 to which the first support substrate 2 is bonded is one principal surface (hereinafter, said one principal surface is referred to as a first principal surface 1a) of two principal surfaces of the piezoelectric substrate 1 (surfaces of the piezoelectric substrate 1 facing in a thickness direction X of the piezoelectric substrate 1).

One surface of the first support substrate 2 to which the piezoelectric substrate 1 bonded has a size that is the same as or larger than the first principal surface 1a, and the bonding is carried out favorably in such a manner that the first principal surface 1a corresponds to or falls within said one surface.

Examples of the piezoelectric substrate 1 include a PZT substrate of 50 mm×50 mm×0.2 mm. The piezoelectric substrate 1 is not limited to a substrate composed of one plate material and may be a laminate substrate obtained by laminating a plurality of plate materials. Examples of the laminate substrate include a substrate obtained by joining two piezoelectric substrates subjected to a polarization treatment in a thickness direction thereof in such a manner that polarization directions thereof oppose or reverse each other.

Examples of the first support substrate 2 include a transparent glass substrate having a diameter of 100 mm and a thickness of 0.5 mm.

The bonding layer 3 is formed by a material relatively easily separable from the first piezoelectric substrate 1 and the first support substrate 2. For example, the bonding layer 3 has a property of dissolving or decomposing, or lowering or losing its adhesion to the piezoelectric substrate 1 by etching with a liquid, heating or laser irradiation. Examples of a material having the property lowering or losing its adhesion to the piezoelectric substrate 1 by laser irradiation include photo-curable resins.

In addition, a release layer (not illustrated) may be formed on the surface of the first support substrate 2 to which the piezoelectric substrate 1 is bonded.

For example, the release layer has a property of dissolving or decomposing, or lowering or losing its adhesion to any one or both of the first support substrate 2 and the bonding layer 3 by etching with a liquid, heating or laser irradiation. As an example, such a release layer is realized by the photothermal conversion layer used in WSS disclosed in Japanese Patent No. 4565804.

Such a photothermal conversion layer contains a light absorbing agent and a heat-decomposable resin. Radiation energy irradiated in the form of laser beam on the photothermal conversion layer is absorbed in the light absorbing agent and converted to thermal energy. The resin is thermally decomposed by the thermal energy generated. A gas generated becomes a void layer (voids) within the photo-thermal conversion layer and divides the photo-thermal conversion layer into two layers to separate the support substrate and the substrate to be supported from each other.

Figure 1B:
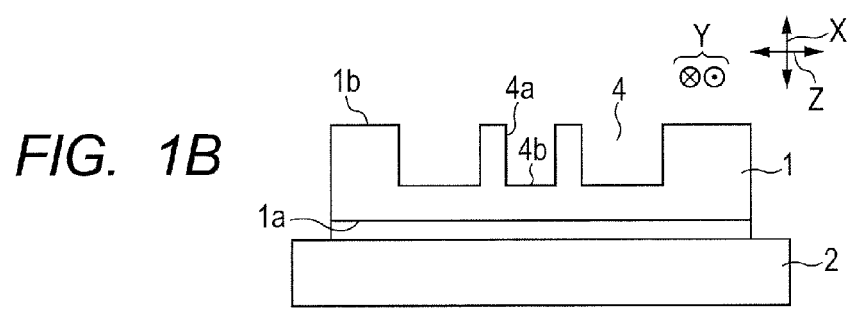

As illustrated in FIG. 1B, a plurality of grooves 4 is then formed in the other principal surface (hereinafter, said other principal surface is referred to as a second principal surface 1b) of the two principal surfaces of the piezoelectric substrate 1 (groove forming step). The grooves 4 are used as a pressure chamber, an air chamber and an ink flow path of the resulting liquid ejection head. Sizes (hereinafter referred to as groove depths) of the respective grooves 4 in a thickness direction X and sizes (hereinafter referred to as groove widths) of the respective grooves 4 in a width direction Z intersecting a longitudinal direction Y along which each groove 4 extends and the thickness direction X may respectively vary according to uses of the grooves 4.

Grinding by a super-abrasive wheel is favorable as a method for forming the grooves 4.

As an example, the plurality of the grooves 4 are periodic grooves of which the sizes (hereinafter referred to as groove lengths) in the longitudinal direction Y are 50 mm, the groove widths are 0.1 mm, the groove depths are 0.12 mm and which include 80 grooves formed at intervals of 0.2 mm between adjoining grooves. In this embodiment, the size between a bottom surface of each groove 4 and the first principal surface 1a (hereinafter referred to as a groove bottom thickness) is 0.08 mm.

The piezoelectric substrate 1 having the plurality of the grooves 4 thus formed was irradiated with reflected light and transmitted light to observe it through a microscope. As a result, no cracking was observed on the piezoelectric substrate 1.

Incidentally, when the piezoelectric substrate 1 is subjected to grooving without bonding the piezoelectric substrate 1 to the first support substrate 2, cracking easily occurs in the piezoelectric substrate 1 during the grooving or in handling (meaning that the piezoelectric substrate 1 is grasped with relatively strong force) before and after the grooving. Such cracking often occurs from the bottom surface of the groove as a starting point.

Figure 1C:
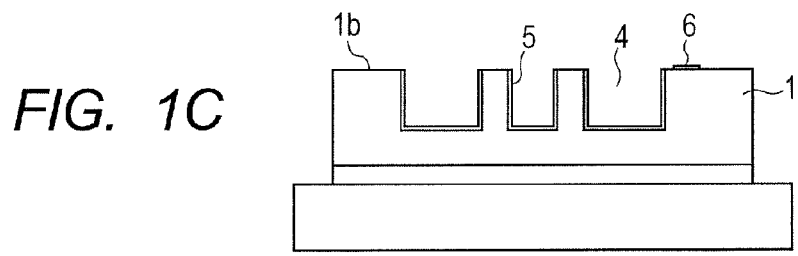

As illustrated in FIG. 1C, a first electrode 5 is then formed on at least one surface of a lateral surface 4a (see FIG. 1B) of the grooves 4, a bottom surface 4b of the grooves 4 and the second principal surface 1b remaining after the grooves 4 are formed. At least one surface of the lateral surface 4a of the grooves 4, the bottom surface 4b of the grooves 4 and the second principal surface 1b mean, for example, a case of the lateral surface 4a of the grooves 4 and the bottom surface 4b of the grooves 4, a case of only the lateral surface 4a of the grooves 4, a case of only the second principal surface 1b, and the like.

In the electrode forming step of forming the first electrodes 5 a first electrode pad 6 may be formed on the second principal surface 1b.

Methods for forming the first electrode 5 include a lift-off technique of a metal film including the process of photolithography, metal film forming and release of a resist. A method for forming the metal film is favorably a sputtering method or a chemical vapor deposition (CVD) method. After a thin seed film is formed on the piezoelectric substrate 1 by lift-off of a metal film, a relatively thick metal film may be formed by plating to form the first electrode 5 and the first electrode pad 6. Examples of the seed layer (film) include a double-layer film of Pd/Cr, and examples of the relatively thick metal film include Au/Ni.

Figure 1D:
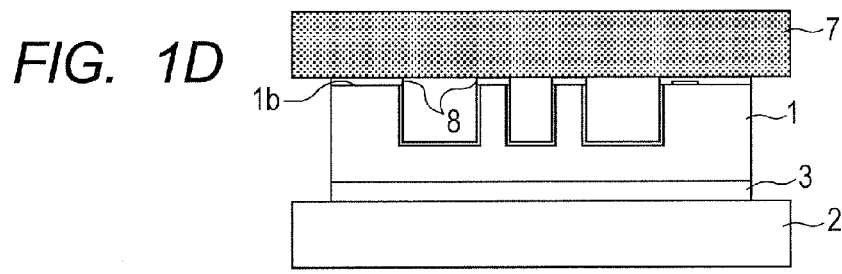

As illustrated in FIG. 1D, the second principal surface 1b of the piezoelectric substrate 1 is then joined to a second support substrate 7. At this time, the piezoelectric substrate 1 is joined to one surface of the second support substrate 7. The second support substrate 7 favorably has a flexural rigidity higher than the piezoelectric substrate 1 subjected to the grooving.

Said one surface of the second support substrate 7, to which the piezoelectric substrate 1 bonded, has a size that is the same as or larger than the second principal surface 1b, and the bonding is carried out favorably in such a manner that the second principal surface 1b corresponds to or falls within said one surface.

As a value of the flexural rigidity of the piezoelectric substrate 1 after the grooving, the flexural rigidity value at a groove bottom where the flexural rigidity of is lowest can be used. The flexural rigidity at the groove bottom can be simply calculated from a material constant of the piezoelectric substrate 1 and the shape of the groove 4.

The second support substrate 7 may be a flat plate. Since the flexural rigidity of the flat plate is determined by a material constant and a thickness of the plate, the flexural rigidity of the second support substrate 7 can be simply calculated by setting the second support substrate 7 in a flat plate.

The piezoelectric substrate 1 bonded to the second support substrate 7 may be processed and heated together with the second support substrate 7 in some cases during the production of the liquid ejection head. Taking easiness of processing in such a step and thermal expansion upon the heating into consideration, the second support substrate 7 is favorably composed of the same material as the piezoelectric substrate 1. As an example, the second support substrate 7 is composed of the same material as the piezoelectric substrate 1 and has a thickness of 2 mm. In addition, an ink flow path and an electrode wiring may be formed on the second support substrate 7.

The joining of the piezoelectric substrate 1 to the second support substrate 7 is conducted through, for example, a joining layer 8. The joining layer 8 is composed of, for example, a thermosetting resin.

The joint strength between the second support substrate 7 and the piezoelectric substrate 1 through the joining layer 8 is desirably sufficiently stronger than the joint strength between the first support substrate 2 and the piezoelectric substrate 1 through the bonding layer 3. As an example, the joint strength between the second support substrate 7 and the piezoelectric substrate 1 through the joining layer 8 is 3 MPa or more. This is a strength simply realizable by a commercially available adhesive. As a method for the joining, for example, the joining layer 8 is applied on to the second principal surface 1b of the piezoelectric substrate 1 by a transfer method, and the piezoelectric substrate 1 is then bonded to the second support substrate 7 to join them to each other under pressurizing and heating conditions.

Figure 1E:
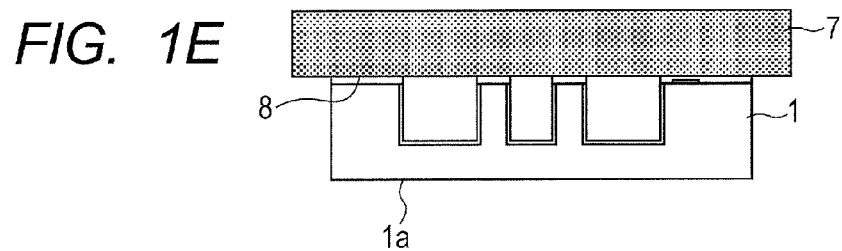

As illustrated in FIG. 1E, the first support substrate 2 (see FIG. 1D) is separated from the piezoelectric substrate 1. Examples of a separating method include the separating method used in WSS disclosed in Japanese Patent No. 4565804.

In the separating method used in WSS, the first support substrate 2 is a transparent glass substrate, and a release layer is formed on the surface of the transparent first support substrate 2. Since the release layer is decomposed by laser irradiation passing through the transparent first support substrate 2, the transparent first support substrate 2 is easily separated from the bonding layer 3.

The bonding layer 3 is composed of a resin having relatively low rigidity. Accordingly, the bonding layer 3 is easily peeled off from the first principal surface 1a of the piezoelectric substrate 1. In order to peel off the bonding layer 3 from the first principal surface 1a, it is only necessary to, for example, stick a pressure sensitive adhesive tape on the surface of the bonding layer 3 and then pull the pressure sensitive adhesive tape.

After the piezoelectric substrate 1 is separated from the bonding layer 3, the piezoelectric substrate 1 is cleaned as needed. Examples of a cleaning method include dry cleaning by plasma and wet cleaning by a solvent or jet fluid.

According to the production process of this embodiment, a plurality of grooves 4 are formed in the second principal surface 1b of the piezoelectric substrate 1 in such a state that the first principal surface 1a of the piezoelectric substrate 1 is bonded to one surface of the first support substrate 2. That is, the whole first principal surface 1a of the piezoelectric substrate 1 is supported by the first support substrate 2 when the grooves 4 are formed. Accordingly, the piezoelectric substrate 1 is not bent even when force in the thickness direction X is applied to the piezoelectric substrate 1 upon the grooving, so that the piezoelectric substrate 1 is not broken.

In addition, when the first support substrate 2 is separated from the piezoelectric substrate 1, the second principal surface 1b of the piezoelectric substrate 1 is bonded to one surface of the second support substrate 7. Since the whole second principal surface 1b is supported by the second support substrate 7, the piezoelectric substrate 1 is not bent in the thickness direction X, so that the piezoelectric substrate 1 is not broken.

As described above, a plurality of grooves 4 can be formed in the piezoelectric substrate 1 without incurring breakage thereof even when the piezoelectric substrate 1 has relatively low flexural rigidity and is larger and thinner.

The piezoelectric substrate 1 is provided as a part of a liquid ejection head in such a state that the second support substrate 7 is bonded. When a greater number of grooves 4 are formed in the piezoelectric substrate 1, a greater number of pressure chambers can be provided in the piezoelectric substrate 1, and ejection orifices can be provided at a higher density. As a result, a liquid ejection head having ejection orifices arranged at a higher density and capable of meeting large-size printing can be easily produced.

Second Embodiment:

A process for producing a liquid ejection head according to a second embodiment will now be described with reference to FIGS. 2A and 2B.

Figure 2A:
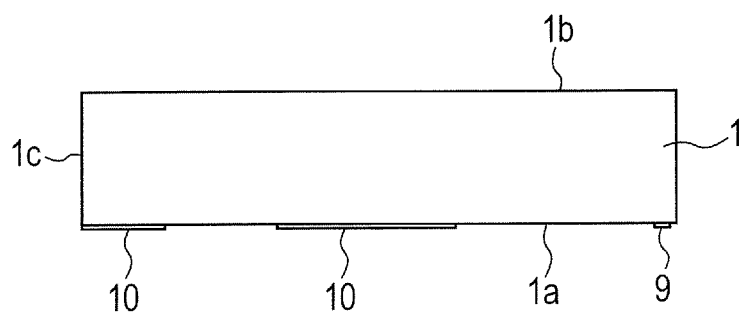
FIGS. 2A and 2B are sectional views illustrating a process for producing a liquid ejection head according to a second embodiment.
Figure 2B:
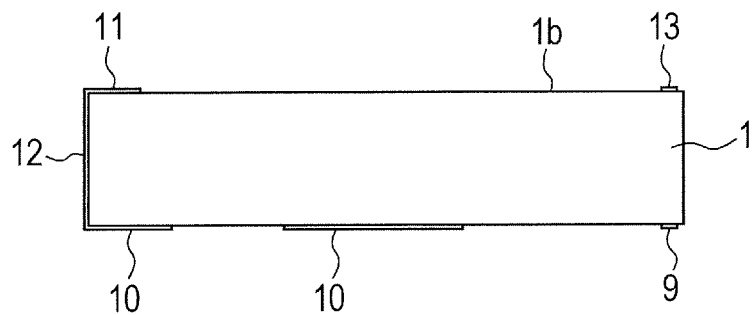

FIGS. 2A and 2B are sectional views illustrating the process for producing a liquid ejection head according to this embodiment. Incidentally, the same signs are given to the same components as those illustrated in FIGS. 1A to 1E to simply describe them.

The production process according to this embodiment includes a step of forming an alignment mark and an electrode on the first principal surface 1a and second principal surface 1b of the piezoelectric substrate 1 prior to the steps included in the first embodiment. The piezoelectric substrate used may be the same as the piezoelectric substrate 1 used in the first embodiment. However, the piezoelectric substrate 1 requires to have such a strength that cracking does not occur in the following steps. Other steps than those in the first embodiment will now be mainly described.

As illustrated in FIG. 2A, a first mark 9 as an alignment mark is first provided on the first principal surface 1a of the piezoelectric substrate 1.

The first mark 9 can be formed by mechanical machining or laser beam machining. A pattern of a metal film formed by a lift-off technique of a metal film including a photolithography process or by an etching technique may also be provided as the first mark 9.

In addition, a second electrode 10 is formed on the first principal surface 1a of the piezoelectric substrate 1. The position of the second electrode 10 is determined using the first mark 9 as a reference.

A method for forming the second electrode 10 may also be the same as the method (see FIG. 1C) for forming the first electrodes 5 in the first embodiment. The second electrode 10 may also be formed by the same method as the method for forming the first mark 9 at the same time of forming the first mark 9.

As illustrated in FIG. 2B, a second electrode pad 11 is then formed on the second principal surface 1b of the piezoelectric substrate 1. A method for forming the second electrode pad 11 may be the same as the method for forming the second electrode 10.

In addition, an electrode wiring 12 is formed on surfaces of the piezoelectric substrate 1 including a lateral surface 1c (see FIG. 2A) of the piezoelectric substrate 1 to electrically connect the second electrode 10 on the first principal surface 1a to the second electrode pad 11 on the second principal surface 1b. The electrode wiring 12 is favorably formed by the same method as the method for forming the second electrode pad 11 at the same time of forming the second electrode pad 11.

Further, a second mark 13 positioned using the first mark 9 as a reference and provided on the first principal surface 1a of the piezoelectric substrate 1 is provided on the second principal surface 1b. A method for providing the second mark 13 may be the same method as the method for providing the first mark 9. The second mark 13 is favorably formed by the same method as the method for forming the second electrode pad 11 at the same time of forming the second electrode pad 11.

An example where the second mark 13 is formed at the same time of forming the second electrode pad 11 and electrode wiring 12 is described below.

First, a seed layer for forming the second electrode pad 11, the electrode wiring 12 and the second mark 13 is formed on the piezoelectric substrate 1 by a lift-off technique of a metal film including a photolithography process.

More specifically, a Cr layer having a thickness of 20 nm and a Pd layer having a thickness of 150 nm are successively formed on the second principal surface 1b and lateral surface 1c of the piezoelectric substrate 1 by a sputtering method to provide the seed layer. Upon the sputtering, the piezoelectric substrate 1 is arranged in such a manner that the second principal surface 1b of the piezoelectric substrate 1 faces a target for sputtering. By utilizing the coatability of sputtering, the seed layer for the electrode wiring 12 can be formed on the lateral surface 1c of the piezoelectric substrate 1 at the same time of forming the seed layer for forming the second mark 12 and second electrode pad 11.

The seed layer is then utilized to successively form a thin Ni and a thin Au film respectively having thicknesses of about 1 μm and about 0.1 μm by an electroless plating method, thereby providing the electrode pad 11, the electrode wiring 12 and the second mark 13. The second electrode 10 formed on the principal surface 1a of the piezoelectric substrate 1 is thereby drawn out on the principal surface 1b of the piezoelectric substrate 1 by means of the electrode wiring 12 and the electrode pad 11. In addition, the second mark 13 is formed using the first mark 9 as a reference.

After the second mark 13 is formed on the piezoelectric substrate 1 as described above, the piezoelectric substrate 1 is subjected to the grooving included in the production process according to the first embodiment.

In this embodiment, the first electrode 5 and a groove 4 (see FIG. 1C) can be formed at predetermined positions corresponding to the second electrode 10 formed on the first principal surface 1a according to the first mark 9 and second mark 13.

Specifically, the groove 4 illustrated in FIG. 1B is favorably formed in a region of the second principal surface 1b opposite a region where the second electrode 10 has been formed. Since the region where the second electrode 10 has been formed is grasped by the position of the second mark 13, the groove 4 is formed at a position corresponding to the second electrode 10 by forming the groove 4 using the second mark 13 as a reference.

The groove 4 is formed at the position corresponding to the second electrode 10, whereby the first electrode 5 (see FIG. 1C) formed on the surface of the piezoelectric substrate 1 including at least the lateral surface 4a (see FIG. 1B) of the groove 4 is formed at a desired position corresponding to the second electrode 10.

According to the production process of this embodiment, a plurality of grooves 4 can be formed in the piezoelectric substrate 1 without incurring breakage thereof even when the piezoelectric substrate 1 is larger and thinner. As a result, a liquid ejection head having ejection orifices arranged at a higher density and capable of meeting large-size printing can be easily produced.

In addition, the position of the second electrode 10 formed on the first principal surface 1a can be matched to the position of the grooves 4 formed in the second principal surface 1b or of the first electrode 5 formed on the side of the second principal surface 1b with relatively high precision by the first and second marks 9 and 13. As a result, a liquid ejection head having higher ejection performance can be easily produced.

Here, the ejection performance means a capacity to eject a greater amount of an ink, a capacity to enhance ejection evenness between plural ejection orifices or a capacity to cause an ink to impact with higher positional precision. Such capacities are known to be improved by lessening misregistration between the position of the second electrode 10 and the position of the grooves 4 or the first electrode 5.

Third Embodiment:

A process for producing a liquid ejection head according to a third embodiment will now be described with reference to FIGS. 3A to 3D.

FIGS. 3A to 3D are sectional views illustrating the process for producing a liquid ejection head according to this embodiment. Incidentally, the same signs are given to the same components as those illustrated in FIGS. 1A to 1E to simply describe them.

The production process according to this embodiment includes a step of providing a third mark 14 on the second support substrate 7 and a fourth mark 15 on the first principal surface 1a of the piezoelectric substrate 1 in addition to the steps included in the production process according to the first embodiment. When the second support substrate 7 is joined to the piezoelectric substrate 1, alignment between the second support substrate 7 and the piezoelectric substrate 1 is made by using the third mark 14 and the fourth mark 15. Other steps than those in the first embodiment will now be mainly described.

Figure 3A:
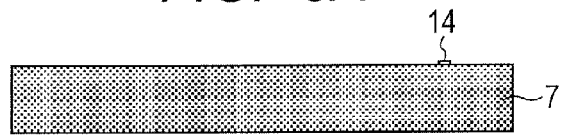
FIGS. 3A, 3B, 3C and 3D are sectional views illustrating a process for producing a liquid ejection head according to a third embodiment.

As illustrated in FIG. 3A, the third mark 14 is first formed on the second support substrate 7.

The third mark 14 can be formed by using the method for forming the first mark 9 (see FIGS. 2A and 2B) included in the production process according to the second embodiment. In FIG. 3A, the third mark 14 is formed on an upper surface of the second support substrate 7. However, the mark 14 may also be formed on a lower surface of the second support substrate 7.

Figure 3B:
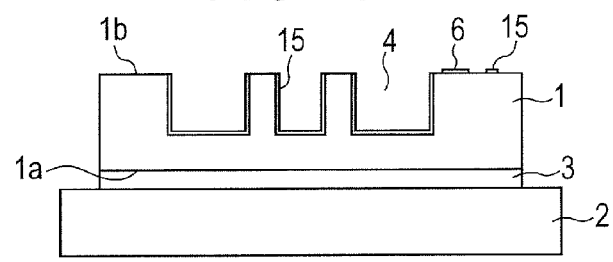

A piezoelectric substrate 1 subjected to the steps up to the step illustrated in FIG. 1C is then provided. The piezoelectric substrate 1 may also be a piezoelectric substrate 1 subjected to the steps according to the second embodiment. As illustrated in FIG. 3B, the fourth mark 15 is then formed on the second principal surface 1b of the piezoelectric substrate 1.

As a method for forming the fourth mark 15, may be used the method for forming the first mark 9 (see FIGS. 2A and 2B) included in the production process according to the second embodiment may be used. The fourth mark 15 is favorably provided at a position corresponding to the groove 4 on the second principal surface 1b of the piezoelectric substrate 1. In order to provide the fourth mark 15 at the position corresponding to the groove 4, the fourth mark 15 is favorably formed by the same method as the method for forming the second mark 13 at the same time of forming the second mark 13. The second mark 13 may also be used as the fourth mark 15. That is, the fourth mark 15 may also be the same as the second mark 13.

Figure 3C:
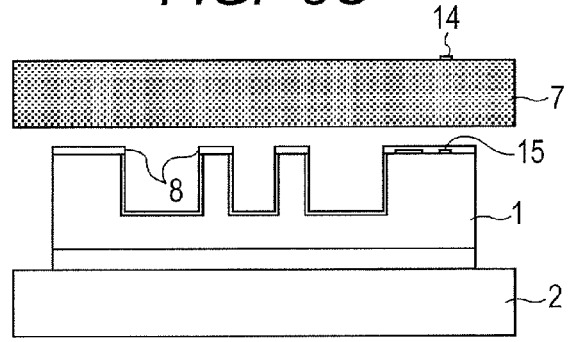
Figure 3D:
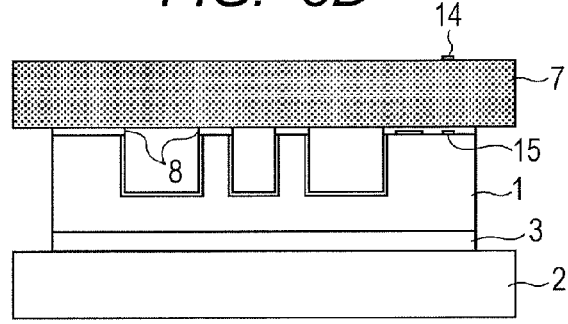

As illustrated in FIG. 3C, alignment between the second support substrate 7 and the piezoelectric substrate 1 is made by using the third mark 14 and the fourth mark 15. Thereafter, as illustrated in FIG. 3D, the second principal surface 1b of the piezoelectric substrate 1 is joined to the second support substrate 7 by the same method as the method (see FIG. 1D) for joining the piezoelectric substrate 1 to the second support substrate 7 in the first embodiment.

The piezoelectric substrate 1 is then separated from the first support substrate 2 by the same method as the method (see FIG. 1E) for separating the piezoelectric substrate 1 from the first support substrate 2 in the first embodiment.

According to the production process of this embodiment, a plurality of grooves 4 can be formed in the piezoelectric substrate 1 without incurring breakage thereof even when the piezoelectric substrate 1 is larger and thinner. As a result, a liquid ejection head having ejection orifices arranged at a higher density and capable of meeting large-size printing can be easily produced.

In addition, the alignment between the piezoelectric substrate 1 and the second support substrate 7 can be made with relatively high precision by the third and fourth marks 14 and 15. As a result, a liquid ejection head having higher ejection performance can be easily produced.

Fourth Embodiment:

A process for producing a liquid ejection head according to a fourth embodiment will now be described with reference to FIGS. 4A to 4C.

Figure 4A:
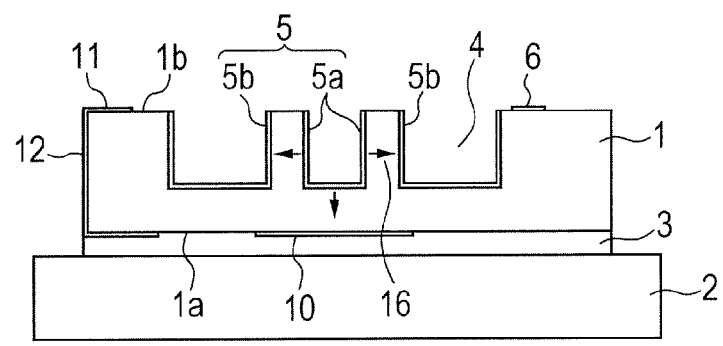
FIGS. 4A, 4B and 4C are sectional views illustrating a process for producing a liquid ejection head according to a fourth embodiment.
Figure 4B:
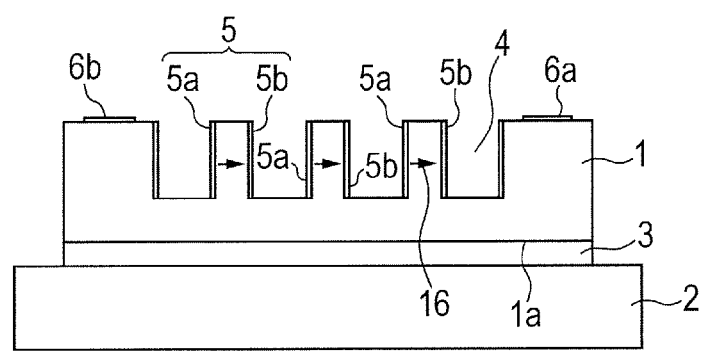
Figure 4C:
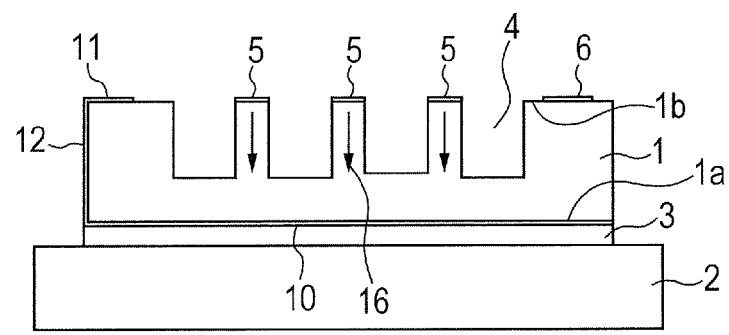

FIGS. 4A to 4C are sectional views illustrating the process for producing a liquid ejection head according to this embodiment. Incidentally, the same signs are given to the same components as those illustrated in FIGS. 1A to 1E to simply describe them.

The production process according to this embodiment includes a step of subjecting the piezoelectric substrate 1 to a polarization treatment in addition to the steps included in the first embodiment and the second embodiment. When the piezoelectric substrate 1 is not subjected to the polarization treatment before the piezoelectric substrate 1 is bonded to the first support substrate 2, it is necessary to subject the piezoelectric substrate 1 to the polarization treatment after an electrode is formed on the piezoelectric substrate 1. In this case, the polarization treatment for the piezoelectric substrate 1 is conducted in a state that the first support substrate 2 has been bonded to the piezoelectric substrate 1.

FIGS. 4A to 4C illustrate three examples of different polarized states. In this embodiment, methods for forming the grooves 4 in the piezoelectric substrate 1, the first and second electrodes 5 and 10, and the first and second electrode pads 6 and 11 are the same as the methods for forming them in the first and second embodiments. Other steps in this embodiment may also be the same as the steps included in the first and second embodiments. Thus, only the step of subjecting the piezoelectric substrate 1 to the polarization treatment is described herein.

As illustrated in FIGS. 4A to 4C, the piezoelectric substrate 1 is bonded to the first support substrate 2 through the bonding layer 3, and the grooves 4 are formed in the second principal surface 1*b* of the piezoelectric substrate 1.

A first example of polarization is described with reference to FIG. 4A. In the example illustrated in FIG. 4A, the first electrode 5 is formed on the lateral surfaces and bottom surfaces of the grooves 4.

Of the first electrode 5, an electrode 5*a* formed on lateral surfaces and bottom surfaces of some grooves 4 is electrically connected to the first electrode pad 6 formed on the second principal surface 1*b* of the piezoelectric substrate 1 through electrode wirings (not illustrated). Of the first electrode 5, an electrode 5*b* formed on lateral surfaces and inside surfaces of grooves 4 adjoining said some grooves 4 is electrically connected to the second electrode pad 11 formed on the second principal surface 1*b* of the piezoelectric substrate 1 through electrode wirings (not illustrated).

In addition, the second electrode 10 is formed on the first principal surface 1*a* of the piezoelectric substrate 1. The second electrode 10 is electrically connected to the second electrode pad 11 through the electrode wiring 12 formed on the lateral surface 1*c* (see FIG. 2A) of the piezoelectric substrate 1.

However, the first electrode pad 6 and the second electrode pad 11 are electrically separated from each other.

An electric field is applied between the first electrode pad 6 and the second electrode pad 11 to conduct the polarization treatment to the walls and bottoms of the grooves 4. A main direction of polarization is indicated by an arrow 16 in FIG. 4A.

When the polarization treatment is conducted to the piezoelectric substrate 1, the electric field strength is set according to the properties of a material of the piezoelectric substrate 1. For example, the electric field strength is set to 1.5 kV/mm. In addition, the polarization treatment is conducted in a state that the piezoelectric substrate 1 has been heated as needed. For example, the electric field is applied in a state that the piezoelectric substrate 1 is kept at 100° C. In order to prevent dielectric breakdown of the piezoelectric substrate 1 by the electric field when the polarization treatment is conducted to the piezoelectric substrate 1, the polarization treatment may also be conducted in a state that the piezoelectric substrate 1 has been immersed in an insulating liquid (for example, silicone oil).

After the polarization of the piezoelectric substrate 1, an aging treatment is conducted as needed. That is, the piezoelectric substrate 1 subjected to the polarization treatment is kept for a certain period of time in a state of having been heated, thereby stabilizing the piezoelectric characteristics thereof. The aging treatment is conducted by, for example, leaving the piezoelectric substrate 1 subjected to the polarization treatment to stand for 10 hours in an oven of 100° C.

A second example of polarization is then described with reference to FIG. 4B. In the example illustrated in FIG. 4B, the first electrode 5 is formed on only both lateral surfaces of the grooves 4, and no electrode is formed on the first principal surface 1*a*.

In addition, first electrode pads 6*a* and 6*b* are formed on the second principal surface 1*b*. However, the first electrode pads 6*a* and 6*b* are electrically separated from each other.

Of the first electrode 5, an electrode 5*a* formed on lateral surfaces of walls of adjoining grooves 4 on one side is electrically connected to one electrode pad 6*a* of the first electrode pads 6*a* and 6*b* through electrode wirings (not illustrated). Of the first electrode 5, an electrode 5*b* formed on lateral surfaces of the walls of the adjoining grooves 4 on the other side is electrically connected to the other electrode pad 6*b* of the first electrode pads 6*a* and 6*b* through electrode wirings (not illustrated).

An electric field is applied between the first electrode pads 6*a* and 6*b* to conduct the polarization treatment to the walls of the grooves 4. A main direction of polarization is indicated by an arrow 16 in FIG. 4B. Conditions for the polarization treatment and the aging treatment are the same as those described in the example illustrated in FIG. 4A.

A third example of polarization is then described with reference to FIG. 4C. In this example illustrated in FIG. 4C, the first electrode 5 is formed on only the second principal surface 1*b* remaining between adjoining grooves 4, and the second electrode 10 is formed on the first principal surface 1*a*.

The first electrode 5 is electrically connected to the first electrode pads 6 formed on the second principal surface 1*b* of the piezoelectric substrate 1 through electrode wirings (not illustrated). The second electrode 10 is electrically connected to the second electrode pad 11 through the electrode wiring 12 formed on the lateral surface 1*c* (see FIG. 2A) of the piezoelectric substrate 1.

An electric field is applied between the first electrode pad 6 and the second electrode pad 11 to conduct the polarization treatment to the walls of the grooves 4. A main direction of polarization is indicated by an arrow 16 in FIG. 4C. Conditions for the polarization treatment and the aging treatment are the same as those described in the example illustrated in FIG. 4A.

According to the production process of this embodiment, a plurality of grooves 4 can be formed in the piezoelectric substrate 1 without incurring breakage thereof even when the piezoelectric substrate 1 is larger and thinner. As a result, a liquid ejection head having ejection orifices arranged at a higher density and capable of meeting large-size printing can be easily produced.

In addition, an electric field is applied to the groove walls and bottoms between the adjoining grooves 4 in a state that the piezoelectric substrate 1 has been bonded to the first support substrate 2, so that the piezoelectric substrate 1 can have desired piezoelectric characteristics without causing cracking on the piezoelectric substrate 1.

Fifth Embodiment:

A process for producing a liquid ejection head according to a fifth embodiment will now be described with reference to FIGS. 5A to 5G.

FIGS. 5A to 5G are sectional views illustrating the process for producing a liquid ejection head according to this embodiment. Incidentally, the same signs are given to the same components as those illustrated in the aforementioned figures to simply describe them.

The production process according to this embodiment includes a series of steps of forming an electrode on a piezoelectric substrate, bonding the piezoelectric substrate to a support substrate, subjecting the piezoelectric substrate to grooving, conducting a polarization treatment to the piezoelectric substrate, and separating the support substrate from the piezoelectric substrate.

Figure 5A:
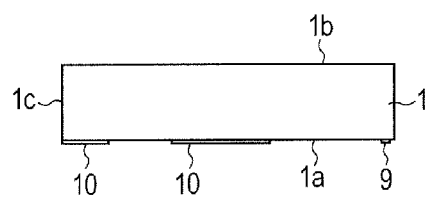
FIGS. 5A, 5B, 5C, 5D, 5E, 5F and 5G are sectional views illustrating a process for producing a liquid ejection head according to a fifth embodiment.

As illustrated in FIG. 5A, a first mark 9 as an alignment mark is first formed on the first principal surface 1*a* of the piezoelectric substrate 1. A method for forming the first mark 9 is the same as the method (see FIG. 2A) for forming the first mark 9 in the second embodiment.

A second electrode 10 is then formed on the first principal surface 1*a* of the piezoelectric substrate 1. A method for forming the second electrode 10 is the same as the method (see FIG. 1C) for forming the first electrodes 5 in the first embodiment.

The second electrode 10 is favorably formed by the same method as the method for forming the first mark 9 at the same time of forming the first mark 9. The second electrode 10 is formed in this manner, whereby the position of the second electrode 10 to the first mark 9 can be determined with higher precision.

Figure 5B:
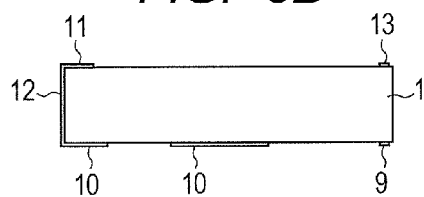

As illustrated in FIG. 5B, a second electrode pad 11 is then formed on the second principal surface 1b of the piezoelectric substrate 1. In addition, an electrode wiring 12 is formed on surfaces of the piezoelectric substrate 1 including a lateral surface 1c (see FIG. 5A) of the piezoelectric substrate 1 to electrically connect the second electrode 10 formed on the first principal surface 1a of the piezoelectric substrate 1 to the second electrode pad 11.

Further, a second mark 13 is formed on the second principal surface 1b at a position determined using as a reference the first mark 9 formed on the first principal surface 1a of the piezoelectric substrate 1. The electrode wiring 12, the second electrode pad 11 and the second mark 13 are favorably formed at the same time according to the method (see 2B) described in the second embodiment.

Figure 5C:
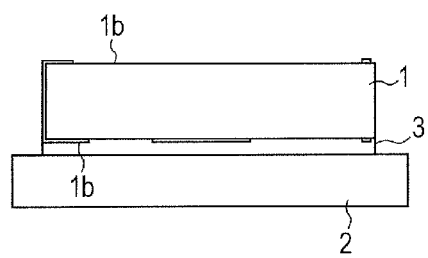

As illustrated in FIG. 5C, the piezoelectric substrate 1 is then bonded to a first support substrate 2 through a bonding layer 3. The first support substrate 2 is a glass substrate having a release layer used in WSS disclosed in Japanese Patent No. 4565804. As an example, the first support substrate 2 is a quartz substrate having a thickness of about 0.5 mm, and the release layer (not illustrated) is a thin film having a thickness of about 1 µm, the film being decomposable by laser irradiation. The bonding layer has a thickness of about 50 µm and composed of an ultraviolet-curable resin.

Figure 5D:
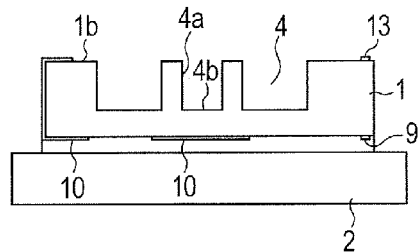

As illustrated in FIG. 5D, a plurality of grooves 4 are then formed in the second principal surface 1b of the piezoelectric substrate 1. The plurality of the grooves 4 correspond to a pressure chamber, an air chamber and an ink flow path of the resulting liquid ejection head. Groove depths and groove widths of the respective grooves 4 may respectively vary according to uses of the grooves 4, such as the pressure chamber and the air chamber.

The shapes of the grooves 4 and a forming method thereof are the same as in the method (see FIG. 1B) described in the first embodiment. However, when the grooves 4 are formed, the positions of the grooves 4 are determined on the basis of the second mark 13. The position of the second electrode 10 is determined on the basis of the first mark 9, and the position of the second mark 13 is determined on the basis of the first mark 9. Accordingly, the positions of the grooves 4 are determined on the basis of the second mark 13, whereby the positions of the plurality of the grooves 4 can correspond to the position of the second electrode 10.

Figure 5E:
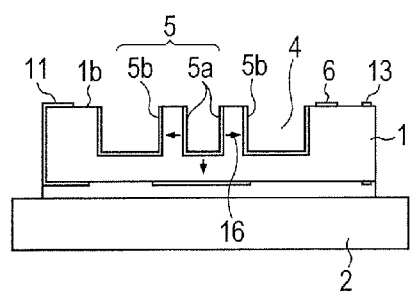

As illustrated in FIG. 5E, a first electrode 5 is then formed on at least one surface of a lateral surface 4a (see FIG. 5D) of the grooves 4, a bottom surface 4b of the grooves 4 and the second principal surface 1b remaining after the grooves 4 are formed.

In addition, a plurality of electrode wirings (not illustrated) are formed at the same time of forming the first electrode 5. Some of the plurality of the electrode wirings are used to electrically connect an electrode 5a of the first electrode 5 formed on inside surfaces of some grooves 4 to the first electrode pad 6. Electrode wirings, of the plurality of the electrode wirings, not connected to the electrode 5a are used to electrically connect an electrode 5b formed on inside surfaces of grooves 4 adjoining said some grooves 4 to the second electrode pad 11.

However, the first electrode pad 6 and the second electrode pad 11 are electrically separated from each other.

Methods for forming the first electrodes 5, the first electrode pad 6, the second electrode pad 11 and the electrode wirings (not illustrated) on the second principal surface 1b may be the same as the method (see FIG. 1C) described in the first embodiment.

An electric field is then applied between the first electrode pad 6 and the second electrode pad 11 to conduct a polarization treatment to the walls and bottoms of the grooves 4. A main direction of polarization is indicated by an arrow 16 in FIG. 5E. An aging treatment of the piezoelectric substrate 1 is then conducted. Conditions for the polarization treatment and the aging treatment are the same as those (see FIG. 4A) described in the fourth embodiment.

Figure 5F:
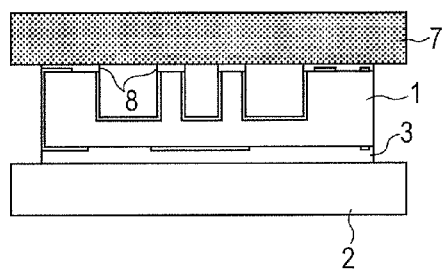

As illustrated in FIG. 5F, the second principal surface 1b of the piezoelectric substrate 1 is then joined to a second support substrate 7. At this time, the piezoelectric substrate 1 is joined to one surface of the second support substrate 7. The second support substrate 7 favorably has flexural rigidity higher than the piezoelectric substrate 1 subjected to the grooving.

As a value of the flexural rigidity of the piezoelectric substrate 1 after the grooving, the flexural rigidity value at a groove bottom where the flexural rigidity is lowest can be used. The flexural rigidity at the groove bottom can be simply calculated from a material constant of the piezoelectric substrate 1 and the shape of the groove 4.

The second support substrate 7 may be a flat plate. Since the flexural rigidity of the flat plate is determined by a material constant and a thickness of the plate, the flexural rigidity of the second support substrate 7 can be simply calculated by setting the second support substrate 7 in a flat plate.

The piezoelectric substrate 1 bonded to the second support substrate 7 may be processed and heated together with the second support substrate 7 in some cases in subsequent step(s) for producing the liquid ejection head. Taking easiness of processing in such a step and thermal expansion upon the heating into consideration, the second support substrate 7 is favorably a member composed of the same material as the piezoelectric substrate 1. The specification of the second support substrate 7 and the joint of the piezoelectric substrate 1 to the second support substrate 7 are the same as those (see FIG. 1D) described in the first embodiment. As an example, the second support substrate 7 is composed of the same material as the piezoelectric substrate 1 and has a thickness of 5 mm. The joining layer 8 is composed of a thermosetting resin. The joint strength between the second support substrate 7 and the piezoelectric substrate 1 through the joining layer 8 is favorably 5 MPa or more.

Figure 5G:
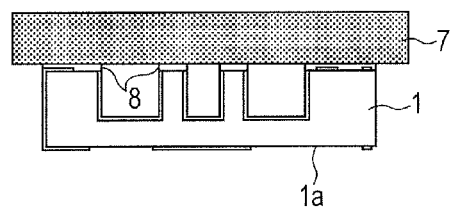

As illustrated in FIG. 5G, the first support substrate 2 (see FIG. 5F) is then separated from the piezoelectric substrate 1. A separating method is the same as the method (see FIG. 1E) described in the first embodiment. Examples thereof include the separating method used in WSS disclosed in Japanese Patent No. 4565804.

In the separating method used in WSS, the first support substrate 2 is a transparent glass substrate, and a release layer is formed on the surface of the transparent first support substrate 2. Since the release layer is decomposed by laser irradiation passing through the transparent first support substrate 2, the transparent first support substrate 2 is easily separated from the bonding layer 3.

According to the production process of this embodiment, a plurality of grooves 4 can be formed in the piezoelectric substrate 1 without incurring breakage thereof even when the piezoelectric substrate 1 is larger and thinner. As a result, a liquid ejection head having ejection orifices arranged at a higher density and capable of meeting large-size printing can be easily produced.

In addition, the position of the second electrode 10 formed on the first principal surface 1*a* can be matched to the positions of the grooves 4 in the second principal surface 1*b* and the first electrode 5 formed on the side of the second principal surface 1*b* with relatively high precision by the first and second marks 9 and 13. As a result, a liquid ejection head having higher ejection performance can be easily produced.

Further, an electric field is applied to the groove walls and bottoms between the adjoining grooves 4 in a state that the piezoelectric substrate 1 has been bonded to the first support substrate 2, so that the piezoelectric substrate 1 can have desired piezoelectric characteristics without causing cracking on the piezoelectric substrate 1.

Sixth Embodiment:

A process for producing a liquid ejection head according to a sixth embodiment will now be described with reference to FIGS. 6A to 6F.

FIGS. 6A to 6F are sectional views illustrating the process for producing a liquid ejection head according to this embodiment. Incidentally, the same signs are given to the same components as those illustrated in the aforementioned figures to simply describe them.

In this embodiment, plural piezoelectric substrates are laminated to produce a liquid ejection head having pressure chambers (or ejection orifices) two-dimensionally arranged. Since the piezoelectric substrates, a first support substrate and a second support substrate are provided through the steps included in the first embodiment to the fifth embodiment, the lamination of the piezoelectric substrates will now be mainly described.

Figure 6A:
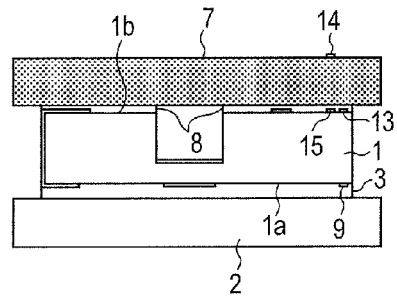
FIGS. 6A, 6B, 6C, 6D, 6E and 6F are sectional views illustrating a process for producing a liquid ejection head according to a sixth embodiment.

As illustrated in FIG. 6A, a piezoelectric substrate 1 in which a first principal surface 1*a* is bonded to the first support substrate 2 and a second principal surface 1*b* is joined to the second support substrate 7 is first provided. The fourth mark 15 is formed on the second principal surface 1*b* of the piezoelectric substrate 1, and the third mark 14 is formed on a surface of the second support substrate 7 on the side opposite to the piezoelectric substrate 1.

When the piezoelectric substrate 1 is joined to the second support substrate 7, alignment between the piezoelectric substrate 1 and the second support substrate 7 is made by using the third mark 14 and the fourth mark 15.

Figure 6B:
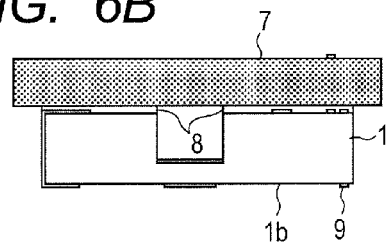

As illustrated in FIG. 6B, the first support substrate 2 (see FIG. 6A) is then separated from the piezoelectric substrate 1.

Figure 6C:
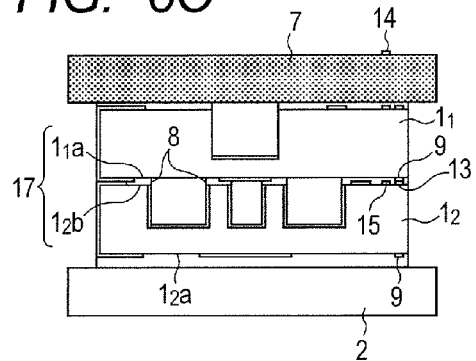

As illustrated in FIG. 6C, a second piezoelectric substrate $1_2$ different from the piezoelectric substrate 1 is then provided. The piezoelectric substrate 1 illustrated in FIGS. 6A and 6B will hereinafter be referred to as the first piezoelectric substrate $1_1$ for the sake of being distinguished from the second piezoelectric substrate $1_2$.

A first principal surface $1_2a$ of the second piezoelectric substrate $1_2$ is bonded to the first support substrate 2, and a plurality of grooves is formed in a second principal surface $1_2b$ of the second piezoelectric substrate $1_2$ on the side opposite to the first principal surface $1_2a$. In addition, the first, second and fourth marks 9, 13 and 15 are formed on the second piezoelectric substrate $1_2$ like the first piezoelectric substrate $1_1$.

After the second piezoelectric substrate $1_2$ is provided, the second principal surface $1_2b$ of the second piezoelectric substrate $1_2$ is joined to the first principal surface $1_1a$ of the first piezoelectric substrate $1_1$ through a joining layer 8 to form a laminate 17 in which the first piezoelectric substrate $1_1$ and the second piezoelectric substrate $1_2$ are laminated.

In a laminate forming step of forming the laminate 17, alignment between the second support substrate and the second piezoelectric substrate $1_2$ is made by using the third mark 14 on the second support substrate 7 and the fourth mark 15 on the second piezoelectric substrate $1_2$. The positions of the groove and electrodes formed in the first piezoelectric substrate $1_1$ can be thereby fitted to the positions of the grooves and electrodes formed in the second piezoelectric substrate $1_2$.

The structure of the second piezoelectric substrate $1_2$, such as the thickness thereof, shapes of the grooves and positions of the electrodes, may differ from the structure of the first piezoelectric substrate $1_1$ according to the design of the resulting liquid ejection head. The same shall apply to the following piezoelectric substrate $1_N$ (N being an integer of 2 or more).

Figure 6D:
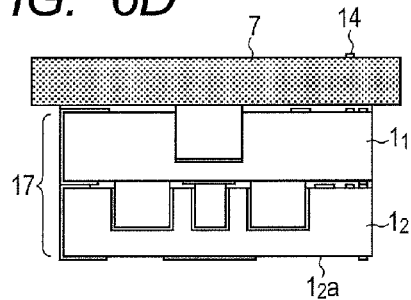

As illustrated in FIG. 6D, the first support substrate 2 (see FIG. 6C) is then separated from the second piezoelectric substrate $1_2$ (second separation step).

Figure 6E:
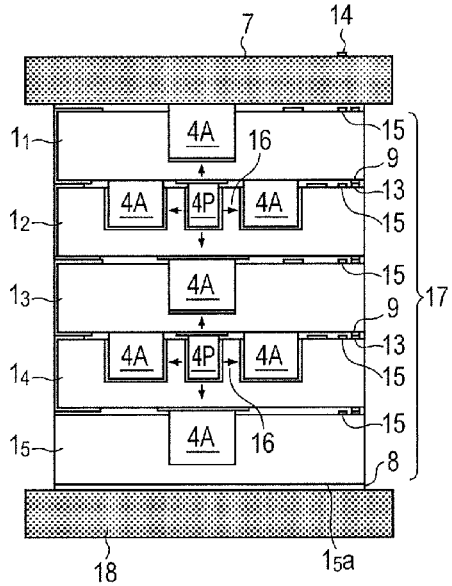

As illustrated in FIG. 6E, the joint and separation respectively illustrated in FIGS. 6C and 6D are repeated plural times up to the Nth piezoelectric substrate $1_N$ (N being an integer of 2 or more; N=5 in FIG. 6E) to laminate a predetermined number of piezoelectric substrates 1 on one another. As a result, a laminate 17 in which N piezoelectric substrates are laminated is obtained.

In the joint between the respective piezoelectric substrates $1_1, 1_2, \ldots, 1_N$, alignment is made by using the third mark 14 on the second support substrate 7 as a common mark, so that the alignment of the grooves and electrodes can be made with higher precision.

No electrode may be formed on the groove 4 of the Nth piezoelectric substrate $1_N$ joined lastly. In addition, a protecting substrate 18 may be joined to the first principal surface $1_N a$ of the Nth piezoelectric substrate $1_N$ as needed. As an example, the protecting substrate 18 is a member composed of the same material as the Nth piezoelectric substrate $1_N$ and having a thickness of 5 mm.

When the Nth piezoelectric substrate $1_N$ is joined to the (N-1)th piezoelectric substrate $1_{N-1}$, alignment between the Nth piezoelectric substrate $1_N$ and the (N-1)th piezoelectric substrate $1_{N-1}$ may also be made by using the second mark 13 on the Nth piezoelectric substrate $1_N$ and the first mark 9 on the (N-1)th piezoelectric substrate $1_{N-1}$.

For example, when the second piezoelectric substrate $1_2$ is joined to the first piezoelectric substrate $1_1$, alignment between the second piezoelectric substrate $1_2$ and the first piezoelectric substrate $1_1$ is made by using the first mark 9 on the first piezoelectric substrate $1_1$ and the second mark 13 on the second piezoelectric substrate $1_2$. Likewise, when the fourth piezoelectric substrate $1_4$ is joined to the third piezoelectric substrate $1_3$, alignment between the fourth piezoelectric substrate $1_4$ and the third piezoelectric substrate $1_3$ is made by using the first mark 9 on the third piezoelectric substrate $1_3$ and the second mark 13 on the fourth piezoelectric substrate $1_4$.

Polarization of the respective the respective piezoelectric substrates $1_1, 1_2, \ldots, 1_N$, may be conducted as described in the fourth embodiment before the respective piezoelectric substrates $1_1, 1_2, \ldots, 1_N$ are laminated or may be conducted after the laminate 17 is formed as illustrated in FIG. 6E.

In the laminate illustrated in FIG. 6E, for example, a groove 4P is used as a pressure chamber in the resulting liquid ejection head, and a groove 4A is used as an air chamber in the liquid ejection head. In this case, four air chambers are formed around one pressure chamber. Since a plurality of grooves are periodically arranged in the respective piezoelectric substrates $1_1, 1_2, \ldots, 1_N$ in a direction along the principal surface of each of the piezoelectric substrates $1_1, 1_2, \ldots, 1_N$, the pressure chambers 4P are two-dimensionally arranged in the laminate 17. When an ejection orifice is formed according to each pressure chamber, a liquid ejection head having ejection orifices two-dimensionally arranged is produced.

As illustrated in FIG. 6E, four walls surrounding a pressure chamber (groove 4P) are subjected to a polarization treatment in, for example, a direction indicated by an arrow 16. A drive signal is applied to the walls of the pressure chamber, whereby the walls of the pressure chamber can be displaced to eject an ink (not illustrated) filled in the pressure chamber. When the walls of the pressure chamber are displaced at the same time in a thickness direction, driving is made by what is called a Gould method.

In FIG. 6E, the pressure chambers (grooves 4P) are arranged in a direction of lamination in such a manner that a center of each pressure chamber is on a straight line parallel to the direction of lamination. As needed, the pressure chambers may also be arranged in such a manner that a center of each pressure chamber is on a straight line diagonally intersecting the direction of lamination as illustrated in FIG. 6F.

For example, a pressure chamber (groove 4P) formed by the (N−n−1)th piezoelectric substrate $1_{N-n-1}$ and the (N−n)th piezoelectric substrate $1_{N-n}$ is considered. Incidentally, n is an integer of 2 or more and N−2 or less. A center of a pressure chamber formed by the (N−n+1)th piezoelectric substrate $1_{N-n+1}$ and the (N−n+2)th piezoelectric substrate $1_{N-n+2}$ is shifted by a distance d in a direction perpendicularly intersecting the direction of lamination to a center of said pressure chamber.

Figure 6F:
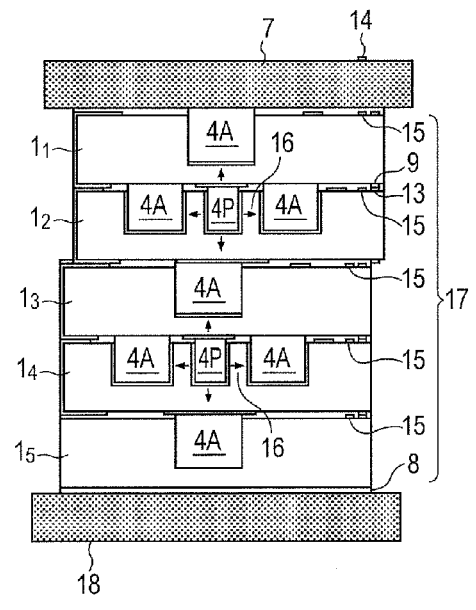

More specifically, in an example illustrated in FIG. 6F, a center of a pressure chamber formed by the third piezoelectric substrate $1_3$ and the fourth piezoelectric substrate $1_4$ is shifted by a desired distance d in a direction perpendicularly intersecting the direction of lamination to a center of a pressure chamber (groove 4P) formed by the first piezoelectric substrate $1_1$ and the second piezoelectric substrate $1_2$. By doing so, a printing density in the direction perpendicularly intersecting the direction of lamination becomes higher than an arranging density of the grooves formed in the respective piezoelectric substrates $1_1, 1_2, \ldots, 1_N$.

As an example, when a plurality of pressure chambers (grooves 4P) are formed with a period of 432 μm in the principal surfaces of the respective piezoelectric substrates, and pressure chambers (grooves P4) of ten layers are present in the direction of lamination, the distance d is set to 43.2 μm. In this case, an ejection orifice density of 600 per inch can be obtained in a direction parallel to the principal surface of the piezoelectric substrate and perpendicular to the groove 4P. This means that a printing density of 600 dpi can be obtained in this direction.

According to the production process of this embodiment, the respective piezoelectric substrates can be subjected to grooving without incurring breakage thereof even when the respective piezoelectric substrates have relatively low flexural rigidity, are relatively large and do not have a sufficient thickness.

In addition, the respective piezoelectric substrates are supported by the first or second support substrate when the respective piezoelectric substrates are joined to each other. Accordingly, a plurality of piezoelectric substrates can be laminated without incurring breakage thereof. As a result, a liquid ejection head having ejection orifices arranged at a higher density and capable of meeting large-size printing can be easily produced.

Seventh Embodiment:

A process for producing a liquid ejection head according to a seventh embodiment will now be described with reference to FIGS. 7A to 7C.

Figure 7A:
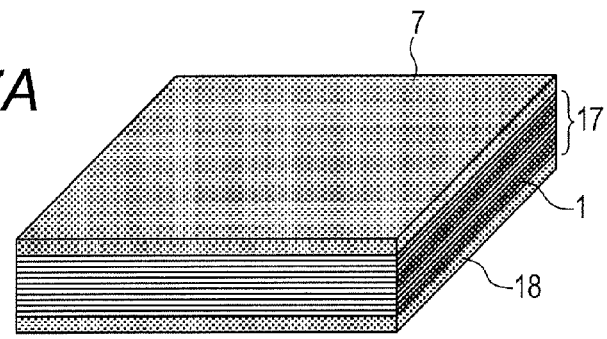
FIGS. 7A, 7B and 7C are sectional views illustrating a process for producing a liquid ejection head according to a seventh embodiment.
Figure 7B:
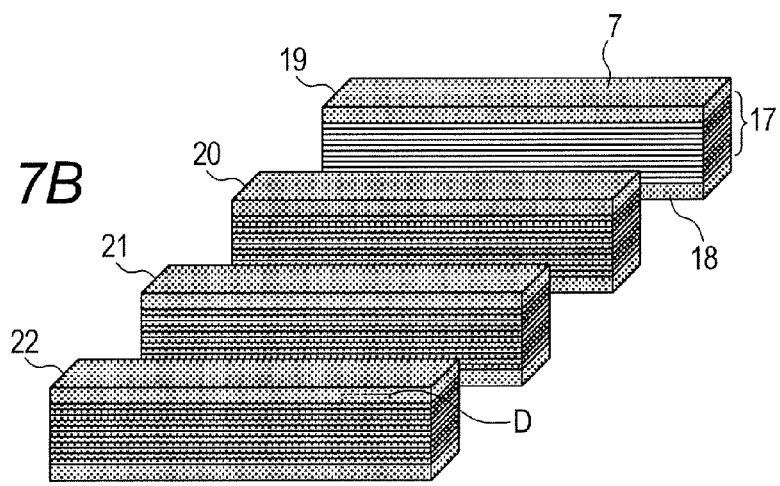
Figure 7C:
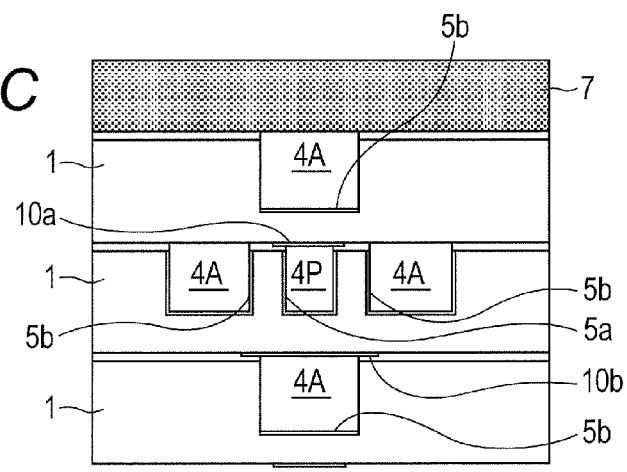

FIGS. 7A to 7C are sectional views illustrating the process for producing a liquid ejection head according to this embodiment. Incidentally, the same signs are given to the same components as those illustrated in the aforementioned figures to simply describe them.

In this embodiment, the piezoelectric substrate described in the first to sixth embodiments is cut in a direction of lamination to produce a plurality of liquid ejection heads. In this embodiment, a cutting method of the piezoelectric substrate will now be mainly described.

In the piezoelectric substrate or the laminate of the piezoelectric substrates described in the first to sixth embodiments, a part of the groove 4 can be a pressure chamber. For example, if a piezoelectric substrate in which a groove having a groove length of 50 mm is formed is cut when a liquid ejection head having a pressure chamber having a length of 6 mm is produced, at most eight liquid ejection heads can be formed from one piezoelectric substrate.

FIG. 7A is a perspective view of a laminate obtained by laminating piezoelectric substrates, FIG. 7B is a perspective view when the laminate illustrated in FIG. 7A is cut.

As illustrated in FIG. 7A, a second support substrate 7 and a protecting substrate 18 are joined to the laminate 17 obtained by laminating the piezoelectric substrates 1. The laminate 17 can be obtained by the production process according to the sixth embodiment. As apparent, this embodiment may also be applied to one piezoelectric substrate described in the first to fifth embodiments.

As illustrated in FIG. 7B, the laminate 17 obtained by laminating the piezoelectric substrates 1 is cut in a direction of lamination to divide it into plural piezoelectric substrate modules. In an example illustrated in FIG. 7B, the laminate 17, the second support substrate 7 and the protecting substrate 18 are divided into four piezoelectric substrate modules.

The sizes of the respective piezoelectric substrate modules 19, 20, 21 and 22 are determined according to design dimensions of the resulting liquid ejection heads. The respective piezoelectric substrate modules 19, 20, 21 and 22 obtained by cutting the laminate 17 are favorably larger by 1 to 2 mm than the final design dimensions of the respective piezoelectric substrate modules 19, 20, 21 and 22.

Examples of a method for dividing the laminate 17 include grinding by a super-abrasive wheel and cutting by a wire saw.

After the laminate 17 is divided into the respective piezoelectric substrate modules 19, 20, 21 and 22, the cut end surfaces of the respective piezoelectric substrate modules 19, 20, 21 and 22 are polished, as needed, to adjust the dimensions at the same time of flattening. In addition, an end surface of an electrode formed on the piezoelectric substrate 1 is exposed by the polishing.

FIG. 7C is an enlarged view of a sectional portion surrounded by a dotted line D of the piezoelectric substrate module 22 illustrated in FIG. 7B. As illustrated in FIG. 7C, a pressure chamber (groove 4P), air chambers (grooves 4A), end surfaces of electrodes 5a and 10a formed on inside walls of the pressure chamber, and end surfaces of electrodes 5b and 10b formed on outside walls of the pressure chamber are exposed to the cut end surface of the piezoelectric substrate module 22.

Each of the piezoelectric substrate modules 19, 20, 21 and 22 illustrated in FIG. 7B are used, whereby a liquid ejection head can be produced according to a production process including the following steps (not illustrated).

An electrode wiring for supplying a drive signal is first formed on the piezoelectric substrate module. The electrode wiring is formed by providing a metal wiring on the cut end surface of the piezoelectric substrate module. A wiring substrate may also be used in place of the metal wiring.

The electrode wiring is formed, for example, in the following manner. One electrode formed on the inside wall of the pressure chamber is electrically connected to the electrode wiring. The electrode wirings connected to the electrodes on the inside walls of the respective pressure chambers are electrically separated from each other. On the other hand, all the electrodes formed on the outside walls of the respective pressure chambers are linked and connected to a common electrode wiring.

Thus, the walls of the respective pressure chambers are, independently of each other, driven. Quite naturally, the same electric signal may also be applied at the same time to the electrodes on the inside walls of the respective pressure chambers to drive the respective pressure chambers at the same time.

It is only necessary to dispersively form the electrode wirings on cut end surfaces on both sides of the piezoelectric substrate module.

An insulating film is then formed on the surfaces of the electrodes formed on the inside walls of the pressure chamber, electrodes formed on the inside walls of the air chambers and the electrode wirings. However, no insulating film is formed on portions, of the electrode wirings, connected to a flexible printed circuit (FPC). The insulating film is, for example, a thin Parylene film and is formed by a chemical vapor deposition (CVD) method.

A rear throttle plate is then joined to one cut end surface (for example, an end surface of the piezoelectric substrate module 22 on the back side of the illustration in FIG. 7B) of the piezoelectric substrate module. The rear throttle plate is joined to the piezoelectric substrate module with, for example, an adhesive.

The rear throttle plate is, for example, an Si substrate in which a through-hole is formed at a position corresponding to each pressure chamber of the piezoelectric substrate module. An opening of each through-hole in the rear throttle plate is smaller than an opening of each pressure chamber.

An orifice plate is then joined to the other cut end surface (for example, an end surface of the piezoelectric substrate module 22 on the near side of the illustration in FIG. 7B) of the piezoelectric substrate module. The orifice plate is joined to the piezoelectric substrate module with, for example, an adhesive.

The orifice plate is, for example, a plate in which a through-hole (ejection orifice) is formed at a position corresponding to each pressure chamber of the piezoelectric substrate module. The surface of such an orifice plate is plated with, for example, Ni. As an example, each ejection orifice is a circular hole having a diameter of 10 μm, and the thickness of the orifice plate is 20 μm. The whole surface or a partial surface of the orifice plate is subjected to a water-repelling treatment or a hydrophilizing treatment as needed.

A flexible printed circuit is then bonded under pressure to the electrode wirings.

Thereafter, a common liquid chamber member having ink inlet and outlet ports is provided and joined to the side of the rear throttle plate. The common liquid chamber member is prepared by, for example, machining an SUS substrate. The common liquid chamber member is joined to the rear throttle plate with, for example, an adhesive.

Lastly, other necessary parts are further assembled to complete a liquid ejection head.

According to the process of this embodiment, a liquid ejection head having ejection orifices arranged at a higher density and higher ejection performance and capable of meeting large-size printing can be produced with higher efficiency.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-043262, filed Feb. 29, 2012, which is hereby incorporated by reference herein in its entirety.

What is claimed is:

1. A process for producing a liquid ejection head, comprising:
   a provision step of providing a piezoelectric substrate, and a first support substrate and a second support substrate for supporting the piezoelectric substrate;
   a bonding step of bonding one surface of the first support substrate to one principal surface of two principal surfaces of the piezoelectric substrate;
   a groove forming step of forming a groove in the other principal surface of the two principal surfaces of the piezoelectric substrate;
   an electrode forming step of forming a first electrode on at least one surface of a lateral surface of the groove, a bottom surface of the groove and the other principal surface remaining after the groove is formed;
   a joining step of joining one surface of the second support substrate to the other principal surface of the piezoelectric substrate; and
   a separation step of separating the first support substrate from the piezoelectric substrate,
   wherein, in the provision step, a piezoelectric substrate other than the piezoelectric substrate joined to the second support substrate is further provided, and
   wherein the production process further comprises, after the separation step,
   a laminate forming step of bonding one surface of two principal surfaces of the other piezoelectric substrate to one surface of the first support substrate and joining the one principal surface of the piezoelectric substrate joined to the second support substrate to the other principal surface of the two principal surfaces of the other piezoelectric substrate to form a laminate in which the piezoelectric substrates are laminated, and
   a second separation step of separating the first support substrate from the laminate.

2. The production process according to claim 1, wherein a flexural rigidity of the second support substrate is higher than that of the piezoelectric substrate after the groove is formed.

3. The production process according to claim 1, further comprising, after the electrode forming step, a step of subjecting the piezoelectric substrate to a polarization treatment using the first electrode.

4. The production process according to claim 1, wherein the laminate forming step and the second separation step are repeated plural times to laminate a predetermined number of the piezoelectric substrates.

5. A process for producing a liquid ejection head, comprising:

a provision step of providing a piezoelectric substrate, and a first support substrate and a second support substrate for supporting the piezoelectric substrate;

a bonding step of bonding one surface of the first support substrate to one principal surface of two principal surfaces of the piezoelectric substrate;

a groove forming step of forming a groove in the other principal surface of the two principal surfaces of the pezoelectric substrate;

an electrode forming step of forming a first electrode on at least one surface of a lateral surface of the groove, a bottom surface of the groove and the other principal surface remaining after the groove is formed;

a joining step of joining one surface of the second support substrate to the other principal surface of the piezoelectric substrate; and a separation step of separating the first support substrate from the piezoelectric substrate, and further comprising, before bonding the one principal surface of the piezoelectric substrate to the first support substrate, a step of forming a first mark and a second electrode positioned using the first mark as a reference on the one principal surface of the piezoelectric substrate, a step of forming an electrode pad on the other principal surface of the piezoelectric substrate to electrically connect the second electrode to the electrode pad, and a step of forming a second mark positioned using the first mark as a reference on the other principal surface of the piezoelectric substrate.

6. A process for producing a liquid ejection head, comprising:

a provision step of providing a piezoelectric substrate, and a first support substrate and a second support substrate for supporting the piezoelectric substrate;

a bonding step of bonding one surface of the first support substrate to one principal surface of two principal surfaces of the piezoelectric substrate;

a groove forming step of forming a groove in the other principal surface of the two principal surfaces of the pezoelectric substrate;

an electrode forming step of forming a first electrode on at least one surface of a lateral surface of the groove, a bottom surface of the groove and the other principal surface remaining after the groove is formed;

a joining step of joining one surface of the second support substrate to the other principal surface of the piezoelectric substrate; and a separation step of separating the first support substrate from the piezoelectric substrate, and further comprising, before the joining step, a step of forming a first mark on the second support substrate, and a step of forming a second mark on the other principal surface of the piezoelectric substrate, wherein, in the joining step, the piezoelectric substrate is joined to the second support substrate after alignment between the piezoelectric substrate and the second support substrate is made by making alignment between the first mark and the second mark.

7. A process for producing a liquid ejection head, comprising:

a provision step of providing a piezoelectric substrate, and a first support substrate and a second support substrate for supporting the piezoelectric substrate;

a bonding step of bonding one surface of the first support substrate to one principal surface of two principal surfaces of the piezoelectric substrate;

a groove forming step of forming a groove in the other principal surface of the two principal surfaces of the pezoelectric substrate;

an electrode forming step of forming a first electrode on at least one surface of a lateral surface of the groove, a bottom surface of the groove and the other principal surface remaining after the groove is formed;

a joining step of joining one surface of the second support substrate to the other principal surface of the piezoelectric substrate; and a separation step of separating the first support substrate from the piezoelectric substrate, and further comprising, after the separation step of separating the first support substrate from the piezoelectric substrate, a step of cutting the piezoelectric substrate joined to the second support substrate together with the second support substrate along a direction intersecting the other principal surface of the piezoelectric substrate.

8. A process for producing a liquid ejection head, comprising:

a provision step of providing a piezoelectric substrate, and a first support substrate and a second support substrate for supporting the piezoelectric substrate;

a step of forming a first mark and a first electrode positioned using the first mark as a reference on one principal surface of two principal surfaces of the piezoelectric substrate;

a step of forming an electrode pad on the other principal surface of the two principal surfaces of the piezoelectric substrate to electrically connect the first electrode to the electrode pad and forming a second mark positioned using the first mark as a reference on the other principal surface;

a step of bonding one surface of the first support substrate to the one principal surface of the piezoelectric substrate;

a step of forming a groove positioned using the second mark as a reference in the other principal surface;

a step of forming a second electrode electrically separated from the first electrode on at least one surface of a lateral surface of the groove, a bottom surface of the groove and the other principal surface remaining after the groove is formed;

a joining step of joining one surface of the second support substrate to the other principal surface of the piezoelectric substrate; and a separation step of separating the first support substrate from the piezoelectric substrate.

9. The production process according to claim 8, wherein, in the provision step, a piezoelectric substrate other than the piezoelectric substrate joined to the second support substrate is further provided, wherein the production process further comprises, before the joining step, a step of forming a third mark on the second support substrate, and a step of forming a fourth mark on the other principal surface of the piezoelectric substrate, wherein, in the joining step, alignment between the piezoelectric substrate and the second support substrate is made by making alignment between the third mark and the fourth mark, and wherein the production process further comprises, after the separation step, a laminate forming step of bonding one surface of two principal surfaces of the other piezoelectric substrate to one surface of the first support substrate, forming the fourth mark on the other principal surface of the two principal surfaces of the other piezoelectric substrate, making alignment between the other piezoelectric substrate and the second support substrate by making alignment between the third mark and the fourth mark and joining the one principal surface of the piezoelectric substrate joined to the second support substrate to the other principal surface of the other piezoelectric substrate to form a laminate in which the piezoelectric substrates are laminated, and a second separation step of separating the first support substrate from the laminate.

10. The production process according to claim 9, wherein the laminate forming step and the second separation step are repeated plural times to laminate a predetermined number of the piezoelectric substrates.

11. The production process according to claim 8, further comprising, after the separation step of separating the first support substrate from the piezoelectric substrate, a step of cutting the piezoelectric substrate joined to the second support substrate together with the second support substrate along a direction intersecting the other principal surface of the piezoelectric substrate.

* * * * *